(12) United States Patent
Sasaki et al.

(10) Patent No.: US 9,070,567 B2
(45) Date of Patent: Jun. 30, 2015

(54) SILICON CARBIDE SUBSTRATE AND METHOD OF MANUFACTURING SILICON CARBIDE SUBSTRATE

(75) Inventors: Makoto Sasaki, Osaka (JP); Takeyoshi Masuda, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 1086 days.

(21) Appl. No.: 13/128,438

(22) PCT Filed: Feb. 9, 2010

(86) PCT No.: PCT/JP2010/051854
§ 371 (c)(1),
(2), (4) Date: May 10, 2011

(87) PCT Pub. No.: WO2010/095538
PCT Pub. Date: Aug. 26, 2010

(65) Prior Publication Data
US 2011/0210342 A1    Sep. 1, 2011

(30) Foreign Application Priority Data

Feb. 18, 2009 (JP) .................................. 2009-035689

(51) Int. Cl.
*C30B 21/02* (2006.01)
*H01L 29/06* (2006.01)
*C30B 29/36* (2006.01)
*H01L 29/04* (2006.01)
(Continued)

(52) U.S. Cl.
CPC ............ *H01L 29/0657* (2013.01); *C30B 29/36* (2013.01); *H01L 29/045* (2013.01); *H01L 29/1608* (2013.01); *H01L 29/66068* (2013.01); *H01L 29/7802* (2013.01); *H01L 23/544* (2013.01); *H01L 2223/54406* (2013.01);
(Continued)

(58) Field of Classification Search
USPC ..................................... 117/86, 90, 94, 95, 98
See application file for complete search history.

(56) References Cited

U.S. PATENT DOCUMENTS

| 4,632,884 A | 12/1986 | Shikatani et al. |
| 5,763,290 A | 6/1998 | Nakajima |

(Continued)

FOREIGN PATENT DOCUMENTS

| CN | 1838428 A | 9/2006 |
| EP | 1 215 730 A1 | 6/2002 |

(Continued)

OTHER PUBLICATIONS

Hiroshi Yano et al., "High Channel Mobility in Inversion Layer of SiC MOSFETs for Power Switching Transistors", Jpn. J. Appl. Phys., vol. 39, Apr. 2000, pp. 2008-2011.

*Primary Examiner* — Robert M Kunemund
(74) *Attorney, Agent, or Firm* — Drinker Biddle & Reath LLP

(57) ABSTRACT

A SiC substrate includes a first orientation flat parallel to the <11-20> direction, and a second orientation flat being in a direction intersecting the first orientation flat and being different from the first orientation flat in length. An alternative SiC substrate has a rectangular plane shape, and a main surface of the substrate includes a first side parallel to the <11-20> direction, a second side in a direction perpendicular to the first side, and a third side connecting the first side to the second side. A length of the third side projected in a direction in which the first side extends is different from a length of the third side projected in a direction in which the second side extends.

13 Claims, 11 Drawing Sheets

(51) Int. Cl.
  *H01L 29/66*  (2006.01)
  *H01L 29/78*  (2006.01)
  *H01L 23/544*  (2006.01)
  *H01L 29/16*  (2006.01)

(52) U.S. Cl.
  CPC ............. *H01L2223/5442* (2013.01); *H01L 2223/54433* (2013.01); *H01L 2223/54493* (2013.01); *H01L 2924/0002* (2013.01)

(56) References Cited

U.S. PATENT DOCUMENTS

| | | | |
|---|---|---|---|
| 6,734,461 B1 * | 5/2004 | Shiomi et al. ................... | 257/77 |
| 188,804 A1 | 9/2004 | Nakayama et al. | |
| 2006/0057850 A1 | 3/2006 | Britt et al. | |
| 2006/0214268 A1 | 9/2006 | Maeyama et al. | |

FOREIGN PATENT DOCUMENTS

| | | |
|---|---|---|
| EP | 1463115 A2 | 9/2004 |
| JP | 63-228710 | 9/1988 |
| JP | 04-113619 | 4/1992 |
| JP | 2002-222746 A | 8/2002 |
| JP | 2004-319950 | 11/2004 |
| JP | 2008-098412 | 4/2008 |
| WO | 01/18872 | 3/2001 |

\* cited by examiner

SILICON CARBIDE SUBSTRATE AND METHOD OF MANUFACTURING SILICON CARBIDE SUBSTRATE

TECHNICAL FIELD

The present invention relates to a silicon carbide substrate and a method of manufacturing a silicon carbide substrate.

BACKGROUND ART

Silicon carbide (SiC) has a wide band gap, high maximum breakdown electric field and high thermal conductivity compared to those of silicon (Si), carrier mobility almost as high as that of silicon, high saturated electron drift velocity and high withstand voltage. Silicon carbide is thus expected to be applied to semiconductor devices required to have higher efficiency, higher withstand voltage, and higher capacity.

One of such semiconductor devices known is a MOSFET (Metal Oxide Semiconductor Field Effect Transistor) of SiC (Non-Patent Document 1, for example). Non-Patent Document 1 discloses that, when MOSFETs are fabricated on the (11-20) plane of a SiC substrate, a drain current along the <1-100> direction is 3 times larger than along the <0001> direction. It is known that a crystal orientation (plane orientation) has a strong influence on electron mobility even when MOSFETs are fabricated on the same plane, as described above.

PRIOR ART DOCUMENTS

Non-Patent Documents

Non-Patent Document 1: Hiroshi YANO et al., "High Channel Mobility in Inversion Layer of SiC MOSFETs for Power Switching Transistors," Jpn. J. Appl. Phys. Vol. 39 (2000) pp. 2008-2011

SUMMARY OF THE INVENTION

Problems to be Solved by the Invention

In general, a semiconductor substrate has an orientation flat (hereinafter also referred to as ori-fla) formed in a portion of its periphery in order to facilitate alignment and identification of crystal orientation. It is known to form an ori-fla for identifying the <0001> direction on the (11-20) plane of the SiC substrate in Non-Patent Document 1.

The present inventors notice the use of a SiC substrate in which a plane orientation of a main surface is substantially {03-38} in a semiconductor device process. A method of forming an ori-fla on a SiC substrate having a substantially {03-38} plane as a main surface is unknown, however. Without an ori-fla, it is difficult to determine a plane direction, a polarity plane and the like, which may result in fabrication of a semiconductor device in an unexpected direction.

Therefore, the present invention provides a SiC substrate in which a plane orientation is defined and a method of manufacturing the SiC substrate.

Means for Solving the Problems

The present inventors studied diligently to identify a plane orientation for forming an ori-fla on a main surface inclined at not less than 50° and not more than 65° in the <1-100> direction as well as at not less than −10° and not more than 10° in the <11-20> direction with respect to the {0001} plane. As a result, they found that a semiconductor device fabricated on this main surface has high channel mobility in a direction inclined at not less than −10° and not more than 10° in the <11-20> direction.

Thus, a SiC substrate according to one aspect of the present invention includes a first orientation flat (first ori-fla) parallel to the <11-20> direction, and a second orientation flat (second ori-fla) being in a direction intersecting the first orientation flat and being different from the first orientation flat in length.

The SiC substrate according to the one aspect of the present invention includes the first ori-fla and the second ori-fla. The first ori-fla can be identified by determining whether the first ori-fla is relatively short or long. Since the first ori-fla indicates the <11-20> direction of high channel mobility, a direction of high channel mobility can be identified in the SiC substrate by the first ori-fla. Namely, a plane orientation can be defined. When a semiconductor device is fabricated with the SiC substrate in which the plane orientation is defined in this manner, a channel can be formed in the direction of high mobility, which leads to fabrication of a semiconductor device with improved properties.

Preferably, in the SiC substrate according to the one aspect of the present invention, the second orientation flat is orthogonal to the first orientation flat.

Accordingly, the first ori-fla indicating the direction of high channel mobility can be defined more clearly.

Preferably, in the SiC substrate according to the one aspect, side surfaces including the first and second orientation flats, respectively, are inclined at not less than −10° and not more than 10° in a direction perpendicular to the main surface.

Accordingly, the side surfaces are substantially perpendicular to the main surface, and are therefore easy to handle with improved workability.

A SiC substrate according to another aspect of the present invention includes a main surface having a rectangular plane shape and being inclined at not less than 50° and not more than 65° in the <1-100> direction as well as at not less than −10° and not more than 10° in the <11-20> direction with respect to the {0001} plane. The main surface includes a first side parallel to the <11-20> direction, a second side in a direction perpendicular to the first side, and a third side connecting the first side to the second side. A length of the third side projected in a direction in which the first side extends is different from a length of the third side projected in a direction in which the second side extends.

In the SiC substrate according to the another aspect of the present invention, the main surface includes the third side, with the length of the third side projected in the direction in which the first side extends being different from the length of the third side projected in the direction in which the second side extends. The first side can be identified by determining whether the length of the third side projected along the first side is relatively short or long. Since the first side indicates the <11-20> direction of high channel mobility, a direction of high channel mobility can be identified in the SiC substrate. Namely, a plane orientation can be defined. When a semiconductor device is fabricated with the SiC substrate in which the plane orientation is defined in this manner, a channel can be formed in the direction of high mobility, which leads to fabrication of a semiconductor device with improved properties.

A SiC substrate according to still another aspect of the present invention includes a main surface having a rectangular plane shape and being inclined at not less than 50° and not more than 65° in the <1-100> direction as well as at not less than −10° and not more than 10° in the <11-20> direction with respect to the {0001} plane. The main surface includes a first side parallel to the <11-20> direction, a second side in a direction perpendicular to the first side, and a mark formed in vicinity of a corner where the first side is connected to the second side.

In the SiC substrate according to the still another aspect of the present invention, the main surface includes the mark in vicinity of the corner where the first side is connected to the second side. Accordingly, the first side can be identified by determining a position where the mark is to be formed with respect to the first side. Since the first side indicates the <11-20> direction of high channel mobility, a direction of high channel mobility can be identified in the SiC substrate. Namely, a plane orientation can be defined. When a semiconductor device is fabricated with the SiC substrate in which the plane orientation is defined in this manner, a channel can be formed in the direction of high mobility, which leads to fabrication of a semiconductor device with improved properties.

Preferably, in the SiC substrate according to the still another aspect, the mark is a laser-irradiated mark, or a scratch by a diamond pen. Accordingly, the mark can be readily formed.

Preferably, in the SiC substrates according to the another aspect and the still another aspect, the first side is different from the second side in length.

Accordingly, the first side can be readily identified by determining whether the first side is relatively short or long.

Preferably, in the SiC substrates according to the another aspect and the still another aspect, side surfaces including the first and second sides, respectively, are inclined at not less than −10° and not more than 10° in a direction perpendicular to the main surface.

Accordingly, the side surfaces are substantially perpendicular to the main surface, and are therefore easy to handle with improved workability.

A manufacturing method according to one aspect for a SiC substrate according to one aspect of the present invention includes the following steps. A SiC ingot is prepared. A SiC substrate including a main surface having a circular or elliptical plane shape and being inclined at not less than 50° and not more than 65° in the <1-100> direction as well as at not less than −10° and not more than 10° in the <11-20> direction with respect to the {0001} plane is cut from the ingot. A first orientation flat parallel to the <11-20> direction and a second orientation flat being in a direction intersecting the first orientation flat and being different from the first orientation flat in length are formed on the SiC substrate.

A manufacturing method according to another aspect for a SiC substrate according to one aspect of the present invention includes the following steps. A SiC ingot is prepared. A first orientation flat parallel to the <11-20> direction and a second orientation flat being in a direction intersecting the first orientation flat and being different from the first orientation flat in length are formed on the ingot. A SiC substrate including a main surface having a circular or elliptical plane shape and being inclined at not less than 50° and not more than 65° in the <1-100> direction as well as at not less than −10° and not more than 10° in the <11-20> direction with respect to a {0001} plane is cut from the ingot including the first and second orientation flats.

With the manufacturing methods according to the one and the another aspects for the SiC substrate according to the one aspect of the present invention, the SiC substrate including the first ori-fla parallel to the <11-20> direction of high channel mobility and the second ori-fla different from the first ori-fla in length can be manufactured. Accordingly, the SiC substrate in which the plane orientation is defined according to the one aspect of the present invention described above can be manufactured.

A manufacturing method according to one aspect for a SiC substrate according to another aspect of the present invention includes the following steps. A SiC ingot is prepared. A SiC substrate including a main surface having a rectangular plane shape and being inclined at not less than 50° and not more than 65° in the <1-100> direction as well as at not less than −10° and not more than 10° in the <11-20> direction with respect to a {0001} plane is cut. The SiC substrate is cut from the ingot in the cutting step such that the main surface includes a first side parallel to the <11-20> direction, a second side in a direction perpendicular to the first side, and a third side connecting the first side to the second side, with a length of the third side projected in a direction in which the first side extends being different from a length of the third side projected in a direction in which the second side extends.

A manufacturing method according to another aspect for a SiC substrate according to another aspect of the present invention includes the following steps. A SiC ingot is prepared. The ingot is processed to include a first side parallel to a <11-20> direction, a second side in a direction perpendicular to the first side, and a third side connecting the first side to the second side, with a length of the third side projected in a direction in which the first side extends being different from a length of the third side projected in a direction in which the second side extends, on a plane inclined at not less than 50° and not more than 65° in the <1-100> direction as well as at not less than −10° and not more than 10° in the <11-20> direction with respect to the {0001} plane. A SiC substrate including a main surface having a rectangular plane shape and being inclined at not less than 50° and not more than 65° in the <1-100> direction as well as at not less than −10° and not more than 10° in the <11-20> direction with respect to the {0001} plane is cut from the ingot.

With the manufacturing methods according to the one and the another aspects for the SiC substrate according to the another aspect of the present invention, a SiC substrate including the first side parallel to the <11-20> direction of high channel mobility and the third side that can be used to identify the first side can be manufactured. Accordingly, the SiC substrate in which the plane orientation is defined according to the another aspect of the present invention described above can be manufactured.

A method of manufacturing the SiC substrate according to the still another aspect includes the following steps. A SiC ingot is prepared. A SiC substrate including a main surface having a rectangular plane shape and being inclined at not less than 50° and not more than 65° in the <1-100> direction as well as at not less than −10° and not more than 10° in the <11-20> direction with respect to the {0001} plane is cut. The cutting step includes the steps of cutting the SiC substrate from the ingot such that the substrate includes a first side parallel to the <11-20> direction and a second side in a direction perpendicular to the first side, and forming a mark in vicinity of a corner where the first side is connected to the second side in the main surface.

With the method of manufacturing the SiC substrate according to the still another aspect of the present invention, the SiC substrate including the first side parallel to the <11-20> direction of high channel mobility and the mark that can be used to identify the first side can be manufactured. Accordingly, the SiC substrate in which the plane orientation is defined according to the still another aspect of the present invention described above can be manufactured.

Effects of the Invention

As described above, according to the SiC substrate and the method of manufacturing the SiC substrate of the present invention, a plane orientation can be defined.

MODES FOR CARRYING OUT THE INVENTION

Figure 1:
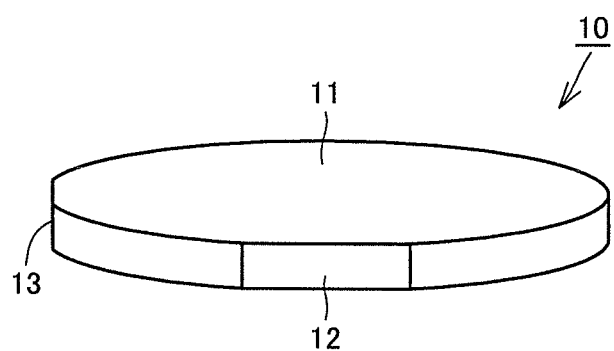
FIG. 1 is a perspective view schematically showing a SiC substrate according to a first embodiment of the present invention.

Embodiments of the present invention will be described below with reference to the drawings. It is noted that the same or corresponding parts have the same reference signs allotted in the drawings, and description thereof will not be repeated. In the present specification, a collective orientation is indicated with < >, an individual plane is indicated with ( ), and a collective plane is indicated with { }. Although "−" (*bar*) is supposed to be attached atop a negative index in terms of crystallography, a negative sign is attached before a negative index in the present specification.

First Embodiment

Figure 2:
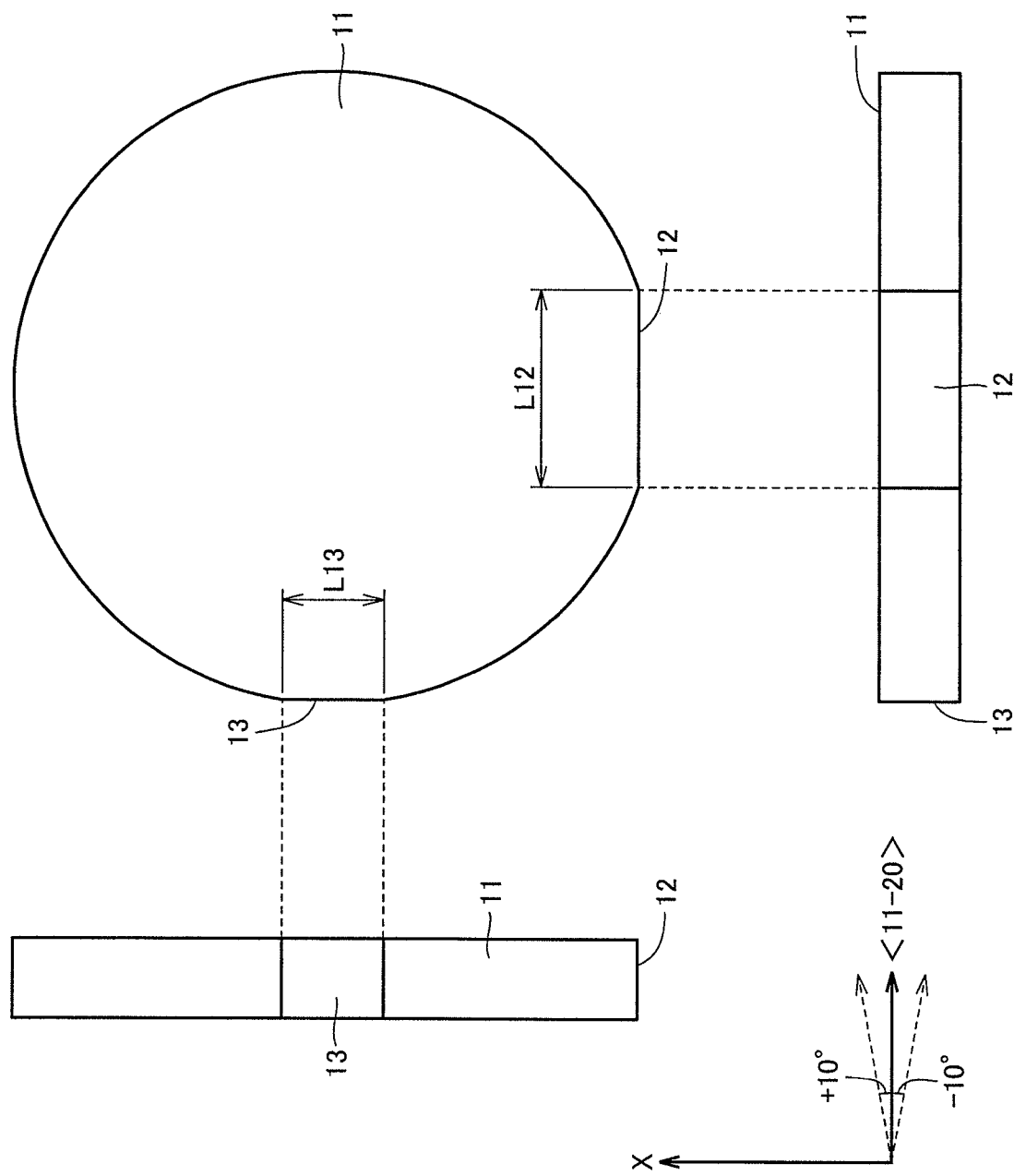
FIG. 2 schematically shows a plan view and a side view of the SiC substrate according to the first embodiment of the present invention.
Figure 3:
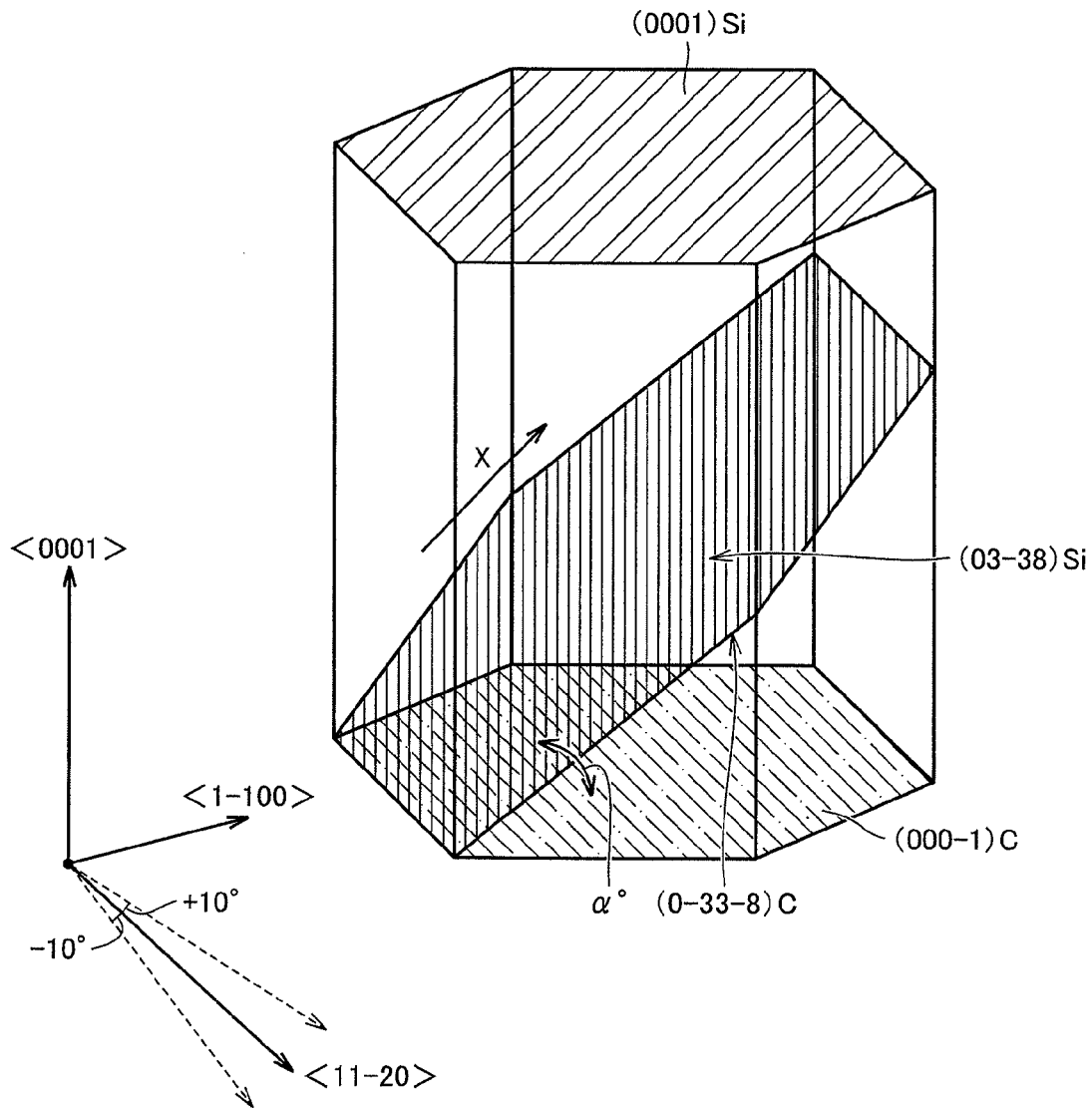
FIG. 3 is a schematic view for illustrating a crystal orientation of a main surface of the SiC substrate according to the first embodiment of the present invention.

Referring to FIGS. 1 to 3, a SiC substrate 10 according to one embodiment of the present invention will be described. As shown in FIGS. 1 and 2, SiC substrate 10 includes a main surface 11, a first ori-fla 12, and a second ori-fla 13.

Main surface 11 has a circular or elliptical plane shape. When main surface 11 is viewed from above, the circular or elliptical shape partially includes straight portions due to first and second ori-flas 12 and 13. As such, the phrase "main surface 11 has a circular or elliptical plane shape" is used herein to include the case where the circular or elliptical shape is partially chipped in plane shape.

Main surface 11 is inclined at not less than 50° and not more than 65° in the <1-100> direction as well as at not less than −10° and not more than 10° in the <11-20> direction with respect to the {0001} plane. Main surface 11 may be inclined at 0° in the <11-20> direction, namely, may not be inclined in the <11-20> direction. It is preferable that main surface 11 be inclined at not less than −10° and not more than 10° in the <11-20> direction with respect to the {03-38} plane.

The plane orientation of main surface 11 will be described with reference to FIG. 3. Main surface 11 is composed of a direction inclined at not less than −10° and not more than 10° in the <11-20> direction and a direction X. Direction X lies between the <0001> direction and the <1-100> direction. That is, direction X indicates a plane between the {0001} plane and the {1-100} plane, and indicates a plane inclined by α with respect to the {0001} plane. In the present embodiment, α is not less than 50° and not more than 65°.

The {03-38} plane lies between the {0001} plane and the {1-100} plane, with α being about 55° (54.7°. Stated differently, the {03-38} plane is inclined at about) 35° (35.3° with respect to the <0001> axis direction. Accordingly, the {03-38} plane has polarity of a surface where Si is exposed (Si face) and a surface where C (carbon) is exposed (C face), as with the {0001} plane.

As shown in FIG. 2, first ori-fla 12 is parallel to the <11-20> direction. It is preferable that second ori-fla 13 be in a direction intersecting first ori-fla 12, and be orthogonal to first ori-fla 12. In the present embodiment, second ori-fla 13 is parallel to direction X.

A length L12 of first ori-fla 12 is different from a length L13 of second ori-fla 13. Although length L12 of first ori-fla 12 is longer than length L13 of second ori-fla 13 in the present embodiment, this is not restrictive. Namely, any relation in terms of size between length L12 of first ori-fla 12 and length L13 of second ori-fla 13 is acceptable. It is preferable that lengths L12 and L13 of first and second ori-flas 12 and 13 be different from each other to such a degree that one can visually discern the size relation.

Lengths L12 and L13 of first and second ori-flas 12 and 13 refer to lengths of the straight portions when SiC substrate 10 is viewed from above, as shown in FIG. 2.

If first ori-fla 12 is formed on the bottom in FIG. 2 and second ori-fla 13 is formed on the left in FIG. 2 with upward direction X and rightward <11-20> direction as shown in FIG. 2, the polarity of main surface 11 is on the Si face side. In addition, second ori-fla 13 is formed on the (0001) C face side. This is preferable because a direction in which main surface 11 is inclined with respect to the (0001) plane can be determined.

Side surfaces including first and second ori-flas 12 and 13, respectively, preferably are inclined at not less than −10° and not more than 10° in a direction perpendicular to main surface 11, more preferably are inclined at not less than −5° and not more than 5° in the direction, and still more preferably are perpendicular to main surface 11. If main surface 11 is the (03-38) plane, the side surfaces including first and second ori-flas 12 and 13 are preferably orthogonal to a plane inclined at not less than 54° and not more than 55° in the <1-100> direction with respect to the (0001) plane. In this case, SiC substrate 10 is easy to handle with improved workability.

Figure 4:
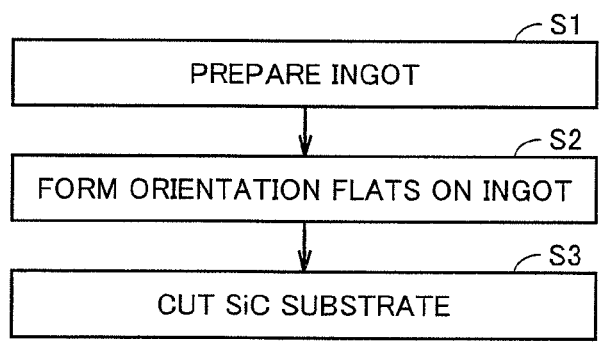
FIG. 4 is a flowchart showing a method of manufacturing the SiC substrate according to the first embodiment of the present invention.
Figure 5:
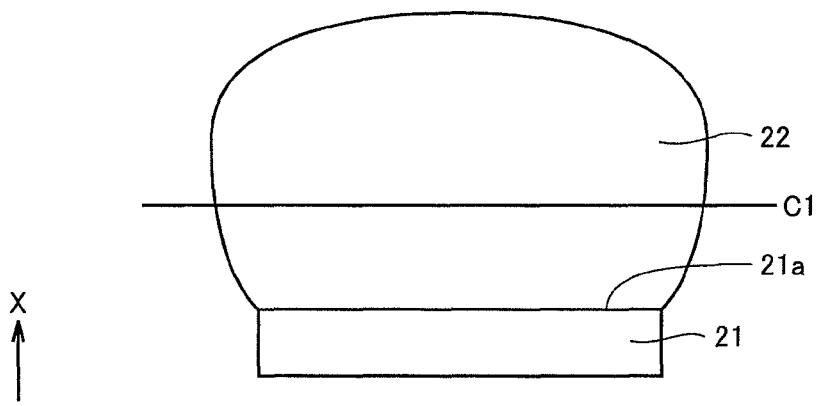
FIG. 5 is a side view schematically showing a SiC ingot formed according to the first embodiment of the present invention.
Figure 6:
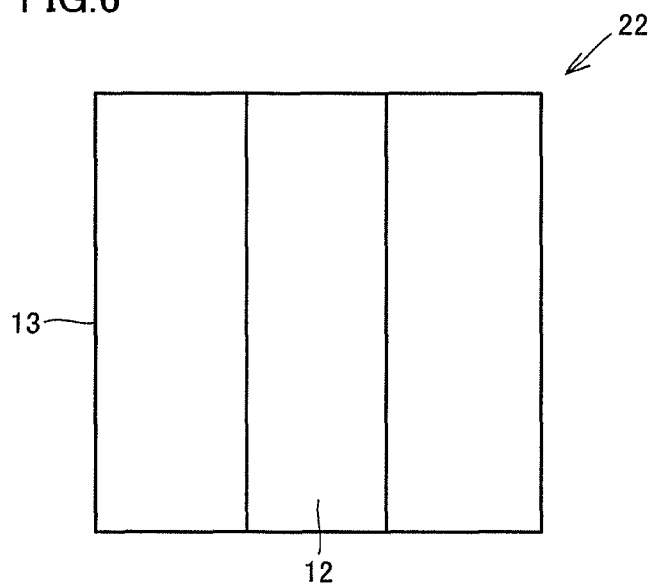
FIG. 6 is a side view schematically showing the ingot provided with first and second ori-flas according to the first embodiment of the present invention.

Referring now to FIGS. 4 to 6, a method of manufacturing the SiC substrate according to the present embodiment is described.

As shown in FIGS. 4 and 5, first, a SiC ingot 22 is prepared (step S1).

At step S1, SiC ingot 22 is grown on a main surface 21a of a base substrate 21, as shown in FIG. 5, for example. Main surface 21a is inclined at not less than 50° and not more than 65° in the <1-100> direction as well as at not less than −10° and not more than 10° in the <11-20> direction with respect to the {0001} plane. Thus, a growth direction of ingot 22 is direction X, and a growth surface of ingot 22 is the same as main surface 21a of base substrate 21.

A growth method is not particularly limited, and an HVPE (Hydride Vapor Phase Epitaxy) method, an MBE (Molecular Beam Epitaxy) method, an OMVPE (OrganoMetallic Vapor Phase Epitaxy) method, a sublimation method, a vapor phase epitaxy method such as a CVD (Chemical Vapor Deposition) method, a flux method, or a liquid phase epitaxy method such as a high nitrogen pressure solution method may be employed, for example.

Base substrate 21 is removed as necessary, such as when base substrate 21 is different from SiC in composition.

Next, as shown in FIGS. 4 and 6, first ori-fla 12 parallel to the <11-20> direction, and second ori-fla 13 being in the direction intersecting first ori-fla 12 and being different from first ori-fla 12 in length are formed on ingot 22 (step S2). At step S2, it is preferable that first ori-fla 12 and second ori-fla 13 intersect with each other.

At step S2, first and second ori-flas 12 and 13 are formed by identifying their respective directions by X-ray diffraction.

Next, a SiC substrate including main surface 11 having a circular or elliptical plane shape and being inclined at not less than 50° and not more than 65° in the <1-100> direction as well as at not less than −10° and not more than 10° in the <11-20> direction with respect to the {0001} plane is cut from ingot 22 including first and second ori-flas 12 and 13 (step S3).

At step S3, the side surfaces including first and second ori-flas 12 and 13, respectively, preferably are inclined at not less than −10° and not more than 10° in a direction perpendicular to main surface 11, more preferably are inclined at not less than −5° and not more than 5° in the direction, and still more preferably are perpendicular to main surface 11.

A cutting method is not particularly limited, and SiC substrate 10 is cut from SiC ingot 22 by slicing or the like. Since main surface 21a of base substrate 21 is in a direction perpendicular to direction X in the present embodiment, SiC substrate 10 is cut along a plane parallel to a plane C1 shown in FIG. 5.

By performing steps S1 to S3 described above, SiC substrate 10 shown in FIGS. 1 and 2 can be manufactured. Step S2 and step S3 may be performed simultaneously or separately.

(First Variation)

Figure 7:
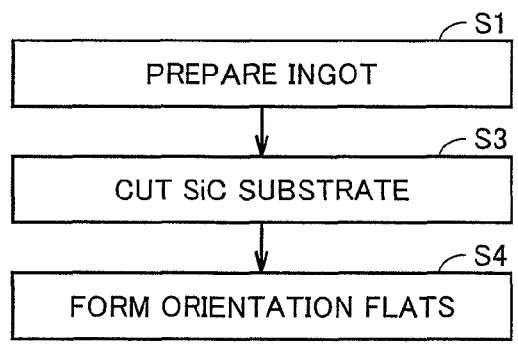
FIG. 7 is a flowchart showing a first variation of the method of manufacturing the SiC substrate according to the first embodiment of the present invention.
Figure 8:
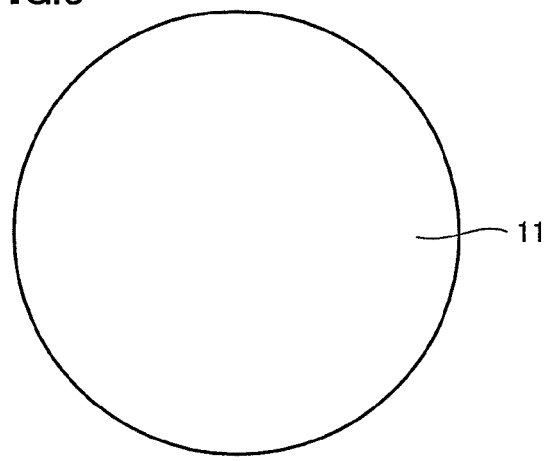
FIG. 8 is a plan view schematically showing a SiC substrate having been cut from an ingot in the first variation of the method of manufacturing the SiC substrate according to the first embodiment of the present invention.

Referring now to FIGS. 7 and 8, a first variation of the method of manufacturing SiC substrate 10 according to the present embodiment is described.

As shown in FIG. 7, first, SiC ingot 22 is prepared in a manner similar to the method described above (step S1).

Next, as shown in FIGS. 7 and 8, a SiC substrate including main surface 11 having a circular or elliptical plane shape and being inclined at not less than 50° and not more than 65° in the <1-100> direction as well as at not less than −10° and not more than 10° in the <11-20> direction with respect to the {0001} plane is cut from ingot 22 (step S3).

Next, first ori-fla 12 parallel to the <11-20> direction, and second ori-fla 13 being in the direction intersecting first ori-fla 12 and being different from first ori-fla 12 in length are formed on the SiC substrate in FIG. 8 (step S4). A method of forming first and second ori-flas 12 and 13 is not particularly limited, and they are formed by slicing, for example.

By performing steps S1, S3 and S4 described above, SiC substrate 10 shown in FIGS. 1 and 2 can be manufactured.

(Second Variation)

Figure 9:
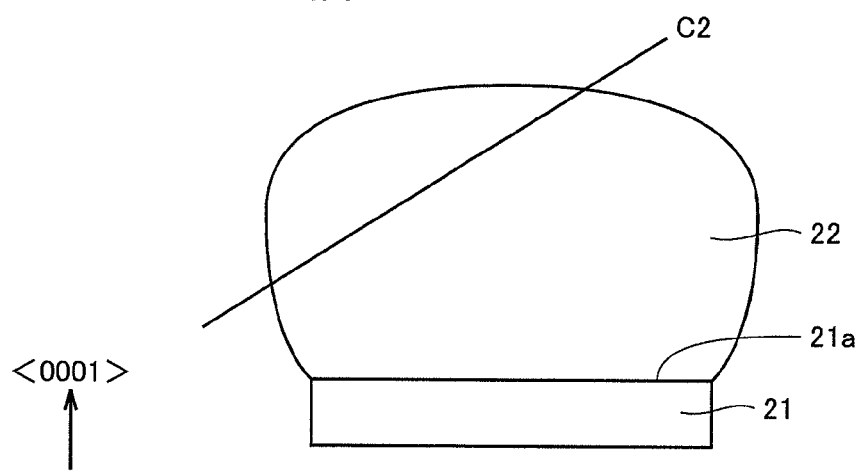
FIG. 9 is a side view schematically showing an ingot in a second variation of the method of manufacturing the SiC substrate according to the first embodiment of the present invention.

Referring now to FIGS. 7 and 9, a second variation of the method of manufacturing SiC substrate 10 according to the present embodiment is described. The second variation is basically similar to the first variation, with a different way of preparing SiC ingot 22.

As shown in FIGS. 7 and 9, first, SiC ingot 22 is prepared (step S1). At step S1, base substrate 21 having the {0001} surface as main surface 21a, for example, is prepared. When SiC ingot 22 is grown on main surface 21a of base substrate 21, a growth direction of ingot 22 is the <0001> direction, and a growth surface of ingot 22 is the same as main surface 21a of base substrate 21.

Next, as shown in FIGS. 7 and 9, a SiC substrate including main surface 11 having a circular or elliptical plane shape and being inclined at not less than 50° and not more than 65° in the <1-100> direction as well as at not less than −10° and not more than 10° in the <11-20> direction with respect to the {0001} plane is cut from ingot 22 (step S3). If the SiC substrate is sliced parallel to main surface 21a of base substrate 21 at step S3, main surface 11 described above is not obtained because the growth surface of SiC ingot 22 is the same as main surface 21a of base substrate 21. In the second variation, therefore, the SiC substrate is cut along a plane C2 parallel to a plane inclined at not less than 50° and not more than 65° in the <1-100> direction as well as at not less than −10° and not more than 10° in the <11-20> direction with respect to the {0001} plane, in order to obtain main surface 11 described above.

Next, as in the first variation, first ori-fla 12 parallel to the <11-20> direction, and second ori-fla 13 being in the direction intersecting first ori-fla 12 and being different from first ori-fla 12 in length are formed on the SiC substrate (step S4).

By performing steps S1, S3 and S4 described above, SiC substrate 10 shown in FIGS. 1 and 2 can be manufactured.

An effect of SiC substrate 10 according to the present embodiment is now described. SiC substrate 10 according to the present embodiment includes first ori-fla 12 parallel to the <11-20> direction, and second ori-fla 13 being in the direction intersecting first ori-fla 12 and being different from first ori-fla 12 in length.

It is known that a crystal orientation (plane orientation) has a strong influence on electron mobility even when SiC semiconductor devices are fabricated on the same plane. The present inventors noticed a plane (main surface 11 of SiC substrate 10) inclined at not less than 50° and not more than 65° in the <1-100> direction with respect to the {0001} plane, and found that a semiconductor device fabricated on this plane has high channel mobility in the direction inclined at not less than −10° and not more than 10° in the <11-20> direction.

SiC substrate 10 according to the present embodiment includes first ori-fla 12 and second ori-fla 13. First ori-fla 12 can be identified by determining whether first ori-fla 12 is relatively short or long. Since first ori-fla 12 indicates the <11-20> direction of high channel mobility, a direction of high channel mobility can be identified in SiC substrate 10. Namely, a plane orientation of high mobility can be defined in SiC substrate 10 according to the present embodiment. Accordingly, when a semiconductor device is fabricated with SiC substrate 10, the <11-20> direction can be identified, which facilitates setting of a wafer of SiC substrate 10 during a semiconductor device process. As a result, a channel can be formed in the direction of high mobility, which leads to fabrication of a semiconductor device with improved properties.

The {03-38} plane is a forbidden plane with X-ray diffraction during processing, and is thus inappropriate as a reference plane. Meanwhile, with the <11-20> axis being on the {03-38} plane, the (11-20) plane which is a low-index plane can be readily used as a reference. In addition, with high X-ray diffraction intensity of the (11-20) plane on the {03-38} plane, the (11-20) plane can be readily used as a reference for enhancing processing accuracy as well.

SiC substrate 10 according to the present embodiment, in which a direction of high channel mobility can be clearly identified as described above, can be appropriately employed in electronic devices such as a bipolar transistor, a field effect transistor (FET), and a spin FET.

Second Embodiment

Figure 10:
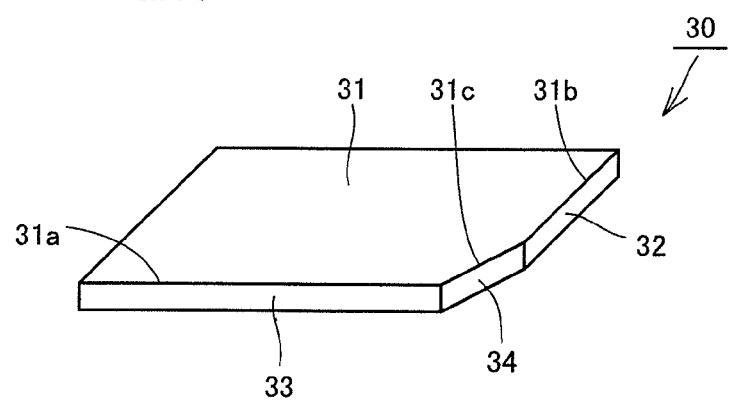
FIG. 10 is a perspective view schematically showing a SiC substrate according to a second embodiment of the present invention.
Figure 11:
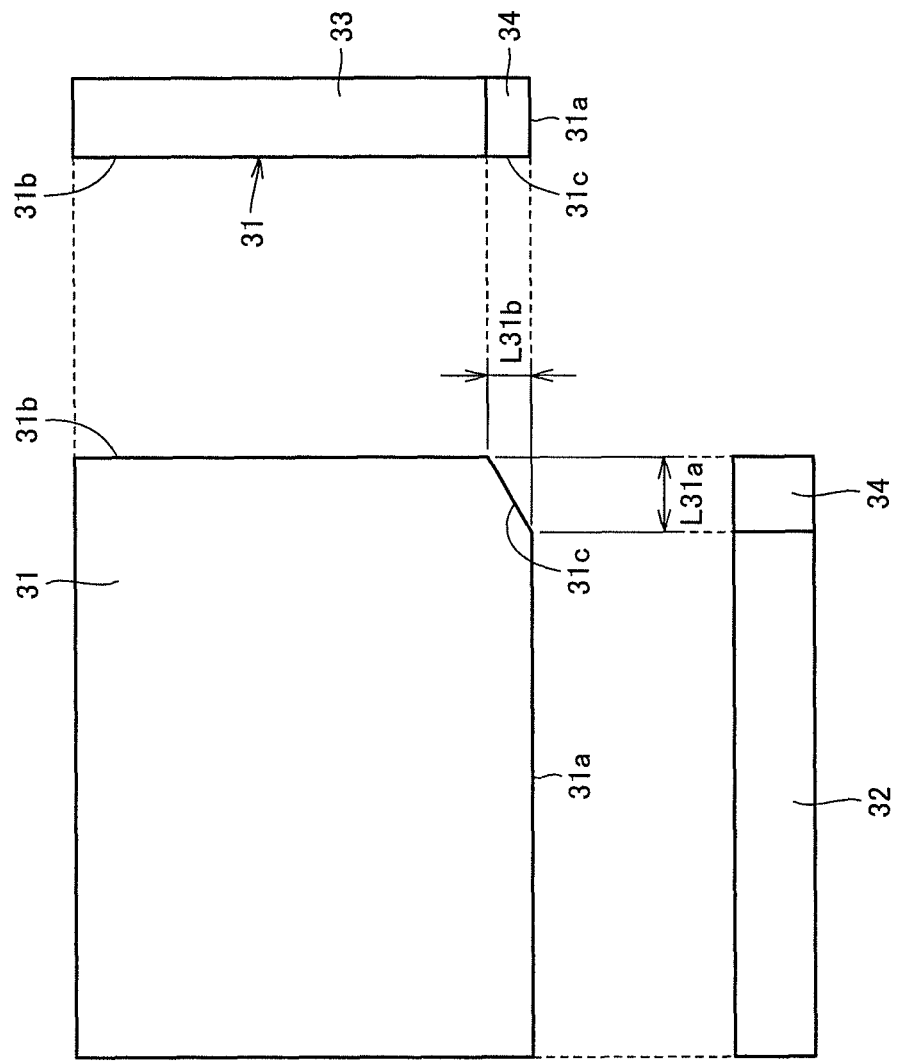
FIG. 11 schematically shows a plan view and a side view of the SiC substrate according to the second embodiment of the present invention.

Referring to FIGS. 10 and 11, a SiC substrate 30 according to the present embodiment will be described. As shown in FIGS. 10 and 11, SiC substrate 30 includes a main surface 31 having a rectangular plane shape and being inclined at not less than 50° and not more than 65° in the <1-100> direction as well as at not less than −10° and not more than 10° in the <11-20> direction with respect to the {0001} plane. In the present embodiment, main surface 31 has a shape with a notch formed in one corner of the quadrangle when SiC substrate 30 is viewed from above.

Main surface 31 includes a first side 31a, a second side 31b, and a third side 31c. First side 31a is parallel to the <11-20> direction. Second side 31b is in a direction perpendicular to first side 31a. In the present embodiment, second side 31b is parallel to direction X shown in FIG. 3. Third side 31c connects first side 31a to second side 31b.

A length L31a of third side 31c projected in a direction in which first side 31a extends is different from a length L31b of third side 31c projected in a direction in which second side 31b extends. Stated differently, length L31a is a width of the notch in the <11-20> direction, and length L31b is a width of the notch in direction X. Although length L31a is longer than length L31b in the present embodiment, this is not restrictive. Namely, any relation in terms of size between length L31a and length L31b is acceptable. It is preferable that length L31a and length L31b be different from each other to such a degree that one can visually discern the size relation.

It is preferable that a length of first side 31a be different from a length of second side 31b. In this case, first side 31a and second side 31b can be recognized more readily.

Side surfaces 32 and 33 including first and second sides 31a and 31b, respectively, preferably are inclined at not less than −10° and not more than 10° in a direction perpendicular to main surface 31, more preferably are inclined at not less than −5° and not more than 5° in the direction, and still more preferably are perpendicular to main surface 31. A side surface 34 including the third side preferably is inclined at not less than −10° and not more than 10° in the direction perpendicular to main surface 31, and more preferably is perpendicular to main surface 31. In this case, SiC substrate 10 is easy to handle with improved workability.

Figure 12:
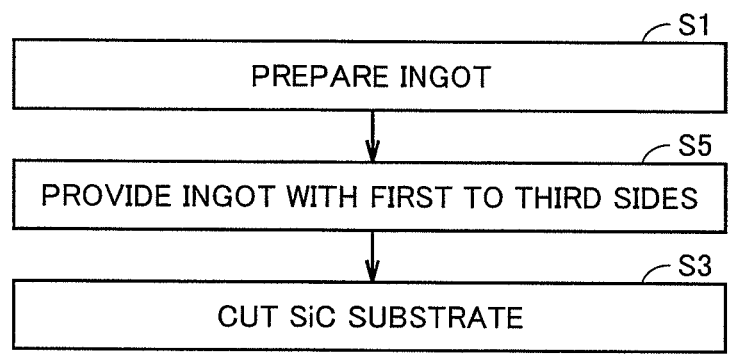
FIG. 12 is a flowchart showing a method of manufacturing the SiC substrate according to the second embodiment of the present invention.
Figure 13:
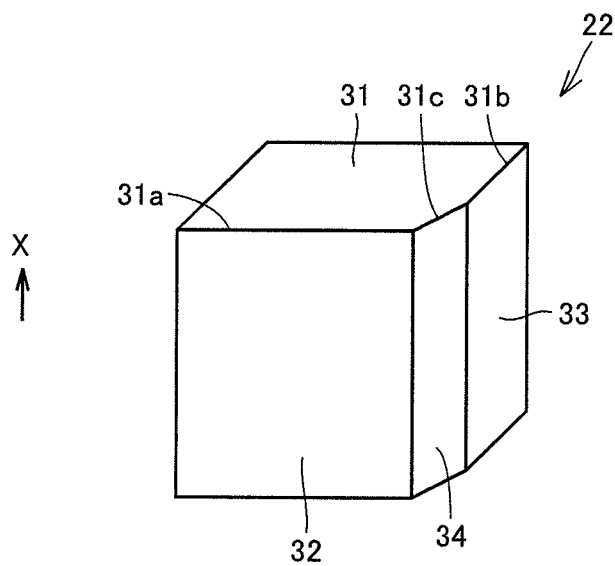
FIG. 13 is a perspective view schematically showing a SiC ingot provided with first to third sides according to the second embodiment of the present invention.

Referring now to FIGS. 5, 12 and 13, a method of manufacturing SiC substrate 30 according to the present embodiment is described.

As shown in FIGS. 5 and 12, first, SiC ingot 22 is prepared in a manner similar to the first embodiment (step S1).

Next, as shown in FIGS. 12 and 13, ingot 22 is processed to include first side 31a parallel to the <11-20> direction, second side 31b in the direction perpendicular to first side 31a, and third side 31c connecting first side 31a to second side 31b, with the length of third side 31c projected in the direction in which first side 31a extends being different from the length of third side 31c projected in the direction in which second side 31b extends, on a plane inclined at not less than 50° and not more than 65° in the <1-100> direction as well as at not less than −10° and not more than 10° in the <11-20> direction with respect to the {0001} plane (step S5).

Next, as shown in FIGS. 10 and 12, SiC substrate 30 including main surface 31 having a rectangular plane shape and being inclined at not less than 50° and not more than 65° in the <1-100> direction as well as at not less than −10° and not more than 10° in the <11-20> direction with respect to the {0001} plane is cut from ingot 22 shown in FIG. 13 (step S3). In the present embodiment, since main surface 31 of ingot 22 is in a direction perpendicular to direction X, SiC substrate 30 is cut along a plane parallel to a plane orthogonal to direction X.

By performing steps S1, S3 and S5 described above, SiC substrate 30 shown in FIGS. 10 and 11 can be manufactured.

(Variation)

Figure 14:
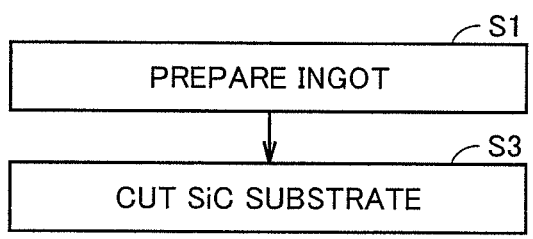
FIG. 14 is a flowchart showing a variation of the method of manufacturing the SiC substrate according to the second embodiment of the present invention.
Figure 15:
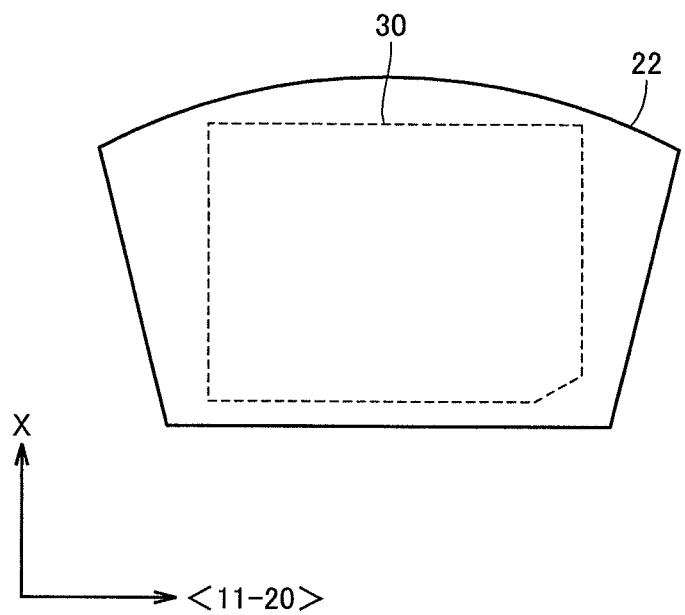
FIG. 15 is a plan view schematically showing an ingot in the variation of the method of manufacturing the SiC substrate according to the second embodiment of the present invention.

Referring now to FIGS. 5, 14 and 15, a variation of the method of manufacturing SiC substrate 30 according to the present embodiment is described. A method of manufacturing SiC substrate 30 according to the variation is basically similar to the method of manufacturing SiC substrate 30 according to the embodiment described above, except that step S5 for forming first to third sides 31a, 31b, 31c and step S3 for cutting are performed simultaneously.

Specifically, as shown in FIG. 14, first, SiC ingot 22 as shown in FIGS. 5 and 15 is prepared in a manner similar to the first embodiment (step S1).

Next, as shown in FIGS. 14 and 15, SiC substrate 30 is cut from ingot 22 shown in FIG. 15 such that SiC substrate 30 includes first to third sides 31a, 31b, and 31c (step S3).

By performing steps S1 and S3 described above, SiC substrate 30 shown in FIGS. 10 and 11 can be manufactured.

As described above, in SiC substrate 30 according to the present embodiment, main surface 31 has third side 31c, with length L31a of third side 31c projected in the direction in which first side 31a extends being different from length L31b of third side 31c projected in the direction in which second side 31b extends. First side 31a can be identified by determining whether length L31a of third side 31c projected along first side 31a is relatively short or long. Since first side 31a indicates the <11-20> direction of high channel mobility, a direction of high channel mobility can be identified in SiC substrate 30. Namely, a plane orientation of high mobility can be defined in SiC substrate 30 according to the present embodiment. Therefore, when a semiconductor device is fabricated with SiC substrate 30, a channel can be formed in the direction of high mobility, which leads to fabrication of a semiconductor device with improved properties.

Third Embodiment

Figure 16:
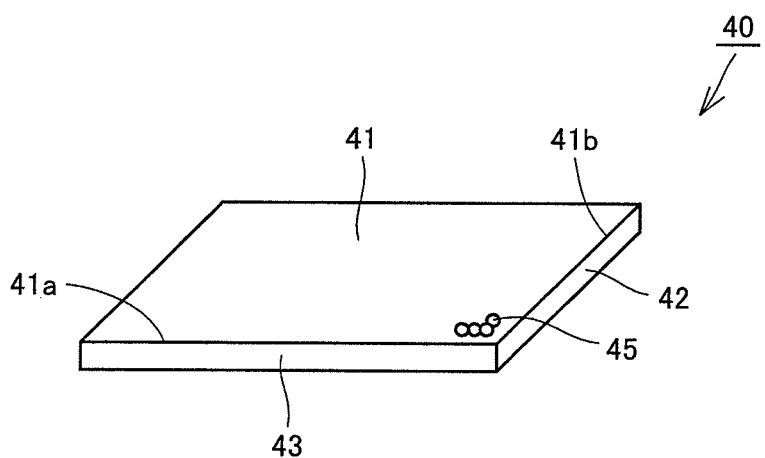
FIG. 16 is a perspective view schematically showing a SiC substrate according to a third embodiment of the present invention.
Figure 17:
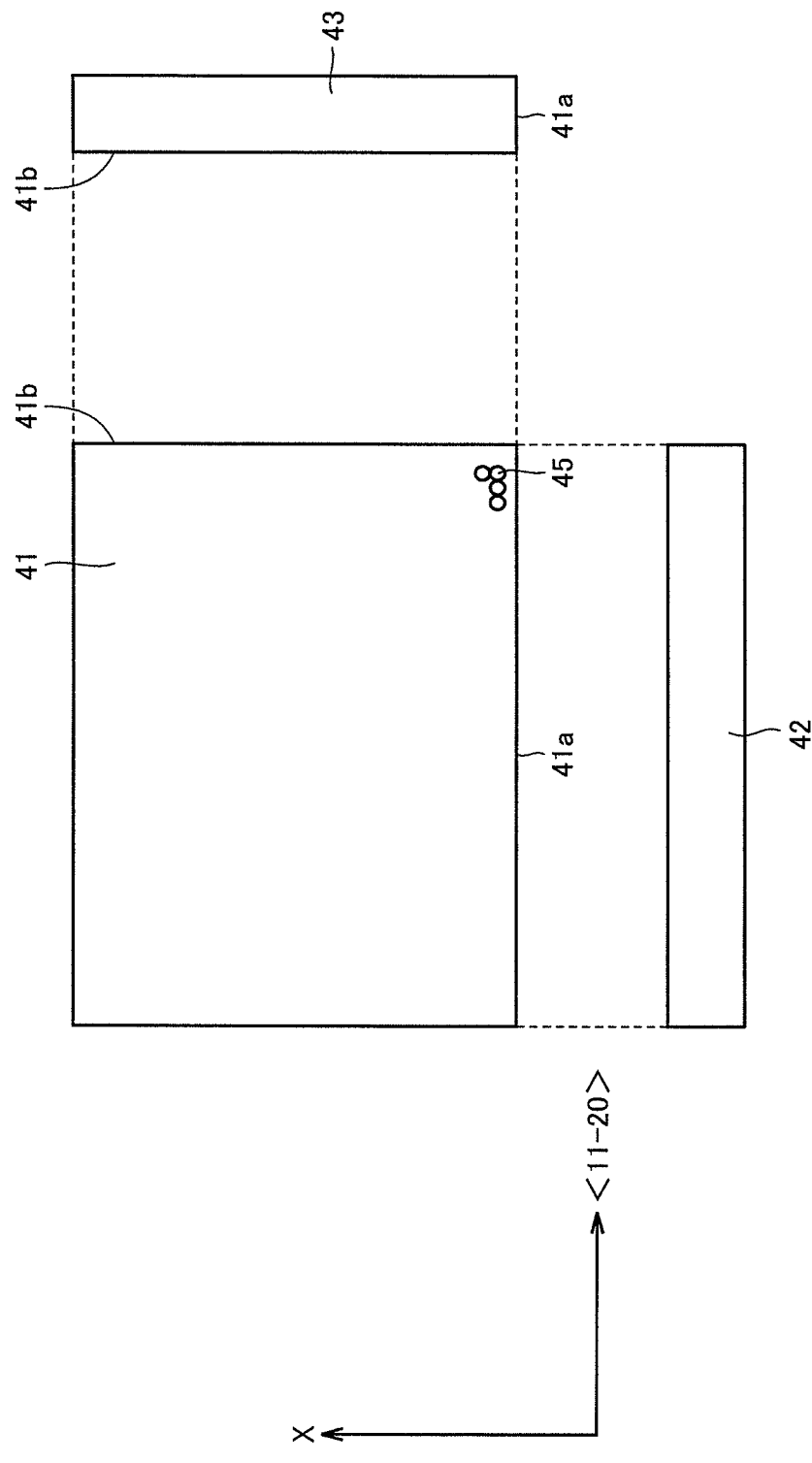
FIG. 17 schematically shows a plan view and a side view of the SiC substrate according to the third embodiment of the present invention.

Referring to FIGS. 16 and 17, a SiC substrate 40 according to the present embodiment will be described. As shown in FIGS. 16 and 17, SiC substrate 40 according to the present embodiment includes a main surface 41 having a rectangular plane shape and being inclined at not less than 50° and not more than 65° in the <1-100> direction as well as at not less than −10° and not more than 10° in the <11-20> direction with respect to the {0001} plane. In the present embodiment, main surface 41 is quadrangular when SiC substrate 40 is viewed from above. Although another rectangular plane shape may be employed, a quadrangle is preferable from the viewpoint of increasing the area of main surface 41.

Main surface 41 includes a first side 41a, a second side 41b, and a mark (marking) 45. First side 41a is parallel to the <11-20> direction. Second side 41b is in a direction perpendicular to first side 41a. In the present embodiment, second side 41b is parallel to direction X shown in FIG. 3.

It is preferable that a length of first side 41a be different from a length of second side 41b. Although any relation in terms of size between the length of first side 41a and the length of second side 41b is acceptable, it is preferable that these lengths be different from each other to such a degree that one can visually discern the size relation. Accordingly, first side 41a can be readily identified by determining whether first side 41a is relatively short or long.

Mark 45 is formed in the vicinity of a corner where first side 41a is connected to second side 41b. It is preferable that mark 45 be a laser-irradiated mark, or a scratch by a diamond pen. Accordingly, mark 45 can be readily formed, and processing accuracy of mark 45 can be improved.

It is preferable to form mark 45 in different sizes and numbers between the <11-20> direction and direction X. In the present embodiment, a larger number of marks 45 are formed in the <11-20> direction. Accordingly, first side 41a can be identified more readily.

It is preferable that mark 45 be a sign vertically and bilaterally asymmetric, a number, or the like. Accordingly, it is easy to determine a polarity plane, and a crystal axis direction to which the direction of first side 41a corresponds.

It is also preferable to form mark 45 on one of the Si face (main surface) side and the C face (rear surface) side, which is opposite to a surface utilized in the device process. SiC has light transmission properties. Accordingly, even if mark 45 is formed on the rear surface and a metal film without light transmission properties or the like is formed, for example, mark 45 formed on the rear surface can be readily recognized with a microscope by polishing the main surface.

Side surfaces 42 and 43 including first and second sides 41a and 41b, respectively, preferably are inclined at not less than −10° and not more than 10° in a direction perpendicular to main surface 41, more preferably are inclined at not less than −5° and not more than 5° in the direction, and still more preferably are perpendicular to main surface 41. In this case, SiC substrate 40 is easy to handle with improved workability.

Referring now to FIGS. 5 and 18 to 20, a method of manufacturing SiC substrate 40 according to the present embodiment is described.

Figure 18:
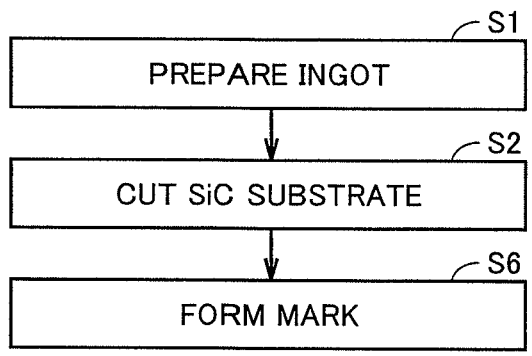
FIG. 18 is a flowchart showing a method of manufacturing the SiC substrate according to the third embodiment of the present invention.

As shown in FIGS. 5 and 18, first, SiC ingot 22 is prepared in a manner similar to the first embodiment (step S1).

Next, SiC substrate 40 including main surface 41 having a rectangular plane shape and being inclined at not less than 50° and not more than 65° in the <1-100> direction as well as at not less than −10° and not more than 10° in the <11-20> direction with respect to the {0001} plane is cut.

Figure 19:
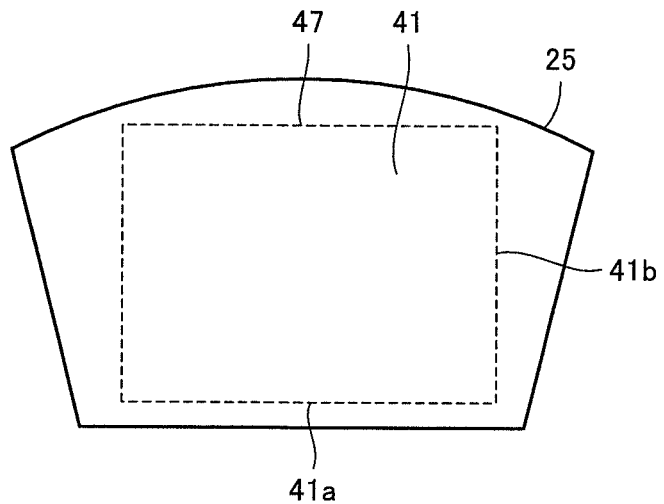
FIG. 19 is a plan view schematically showing an ingot according to the third embodiment of the present invention.
Figure 20:
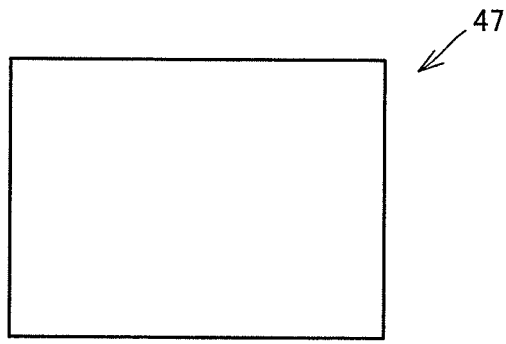
FIG. 20 is a plan view schematically showing a substrate having been cut from the ingot according to the third embodiment of the present invention.

In this step, as shown in FIGS. 19 and 20, a substrate 47 made of SiC is cut from ingot 22 such that substrate 47 includes first side 41a parallel to the <11-20> direction and second side 41b in the direction perpendicular to first side 41a (step S2). Then, mark 45 is formed in the vicinity of the corner where first side 41a is connected to second side 41b in main surface 41 of substrate 47 (step S6).

A method of forming a laser-irradiated mark by laser irradiation, a method of forming a scratch by a diamond pen, or the like may be employed as a method of forming mark 45 at step S6.

By performing steps S1, S2 and S6 described above, SiC substrate 40 shown in FIGS. 16 and 17 can be manufactured.

As described above, in SiC substrate 40 according to the present embodiment, main surface 41 includes mark 45 in the vicinity of the corner where first side 41a is connected to second side 41b. First side 41a can be identified by determining a position where mark 45 is to be formed with respect to first side 41a. In the present embodiment, mark 45 is formed on the right edge of first side 41a. In addition, the number of marks 45 formed in a direction parallel to first side 41a is larger than the number of marks 45 formed in a direction parallel to second side 41b. Thus, first side 41a can be identified in the present embodiment. Since first side 41a indicates the <11-20> direction of high channel mobility, a direction of high channel mobility can be identified in SiC substrate 40. Namely, a plane orientation of high channel mobility can be defined in SiC substrate 40 according to the present embodiment. Therefore, when a semiconductor device is fabricated with SiC substrate 40, a channel can be formed in the direction of high mobility, which leads to fabrication of a semiconductor device with improved properties.

EXAMPLES

In the present example, an effect produced by forming the first ori-fla, the third side, or the mark for identifying the <11-20> direction was examined.

Figure 21:
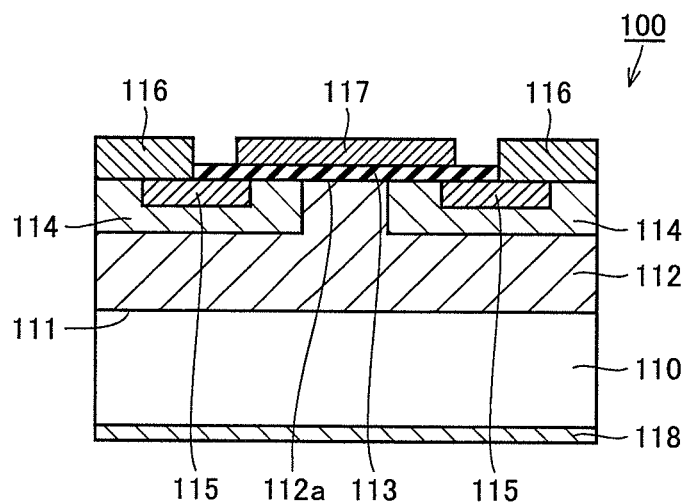
FIG. 21 is a cross-sectional view schematically showing a DMOSFET according to an embodiment.

Specifically, vertical DMOSFETs (Double Implanted Metal Oxide Semiconductor Field Effect Transistors) 100 shown in FIG. 21 each having a channel in a range of not more than −90° from the <11-20> direction were manufactured.

More specifically, first, an n type SiC substrate of the 4H polytype was prepared as a SiC substrate 110. A main surface 111 of SiC substrate 110 was inclined at not less than 50° and not more than 65° in the <1-100> direction as well as at not less than −10° and not more than 10° in the <11-20> direction with respect to the {0001} plane.

Next, a semiconductor layer 112 made of n type SiC containing an n type impurity of higher concentration than SiC substrate 110 was formed on main surface 111 of SiC substrate 110 with the CVD method. A main surface 112a of semiconductor layer 112 was inclined at not less than 50° and not more than 65° in the <1-100> direction as well as at not less than −10° and not more than 10° in the <11-20> direction with respect to the {0001} plane.

Next, an oxide film having been patterned by photolithography and etching was formed as an ion implantation prevention mask in a region other than a region where semiconductor layer 112 had been formed. Thereafter, p type impurity ions were implanted into main surface 112a of semiconductor layer 112. Consequently, a p type impurity diffusion layer 114 was formed in main surface 112a of semiconductor layer 112. P type impurity diffusion layer 114 had a stripe shape extending in the <11-20> direction.

Next, in a region other than a region where an n type impurity diffusion layer 115 was to be formed in main surface 112a of semiconductor layer 112, an oxide film having been patterned by photolithography and etching was formed as an ion implantation prevention mask. Thereafter, n type impurity ions were implanted into a main surface of p type impurity diffusion layer 114. Consequently, n type impurity diffusion layer 115 was formed in the main surface of p type impurity diffusion layer 114. N type impurity diffusion layer 115 had a stripe shape extending in the <11-20> direction.

Next, semiconductor layer 112 including p type impurity diffusion layer 114 and n type impurity diffusion layer 115 was subjected to an activation annealing process. During the activation annealing process, semiconductor layer 112 including p type impurity diffusion layer 114 and n type impurity diffusion layer 115 was heated at a temperature of about 1700° C. for about 30 minutes in an atmosphere of argon gas. Consequently, the p type impurity ions in p type impurity diffusion layer 114 and the n type impurity ions in n type impurity diffusion layer 115 that had been implanted as described above were activated.

Next, an insulating film 13 was formed with dry oxidation (thermal oxidation) to be in contact with the entire main surface 112a of semiconductor layer 112 including p type impurity diffusion layer 114 and n type impurity diffusion layer 115. During the dry oxidation, main surface 112a of semiconductor layer 112 including p type impurity diffusion layer 114 and n type impurity diffusion layer 115 was heated at a temperature of about 1200° C. for about 30 minutes in the air.

Next, semiconductor layer 112 including insulating film 13 was subjected to a nitrogen annealing process. During the nitrogen annealing process, semiconductor layer 112 including insulating film 13 was heated at a temperature of about 1100° C. for about 120 minutes in an atmosphere of nitrogen monoxide (NO) gas. Consequently, a maximum value of nitrogen concentration in a region of not more than 10 nm from an interface between semiconductor layer 112 and insulating film 13 was set to be not less than $1 \times 10^{21}$ cm$^{-3}$.

Semiconductor layer 112 having been subjected to the nitrogen annealing process was further subjected to an inert gas annealing process in an atmosphere of argon gas. During the argon gas annealing process, semiconductor layer 112 having been subjected to the nitrogen annealing process was heated at a temperature of about 1100° C. for about 60 minutes in an atmosphere of argon gas.

Next, insulating film 113 formed as described above was patterned by removing a portion of insulating film 113. Insulating film 113 was patterned in each case such that a channel direction was included in a range of ±90° from the <11-20> direction in main surface 112a of semiconductor layer 112. That is, insulating film 113 was patterned in each case such that the channel direction is parallel to any direction in a range of <11-20> direction −90° to <11-20> direction +90° in main surface 112a of semiconductor layer 112.

The portion of insulating film 113 was removed as follows. An etching mask having been patterned by photolithography and etching to expose a portion where insulating film 113 was removed was formed on a main surface of insulating film 113. Thereafter, the exposed portion of insulating film 113 was removed by etching, to form insulating film 113 shown in FIG. 21.

Next, a source electrode 116 was formed to be in contact with a main surface of n type impurity diffusion layer 115 in main surface 112a of semiconductor layer 112 exposed through the portion where insulating film 113 had been removed. Source electrode 116 was formed by forming a conducting film made of nickel by sputtering on main surface 112a of semiconductor layer 112 exposed after etching of insulating film 113 described above and on a main surface of the etching mask, and then removing the etching mask. That is, the conducting film formed on the main surface of the etching mask was removed (lifted off) along with the etching mask, leaving only the conducting film formed on main surface 112a of semiconductor layer 112 as source electrode 116.

Semiconductor layer 112 including source electrode 116 was subjected to heat treatment for alloyzation. During the heat treatment for alloyzation, semiconductor layer 112 including source electrode 116 was heated at a temperature of about 950° C. for about 2 minutes in an atmosphere of argon gas.

Next, a gate electrode 117 was formed on the main surface of insulating film 113. Gate electrode 117 was formed as follows. A resist mask having an opening in a portion where gate electrode 17 was to be formed was formed by photolithography and etching to cover the entire main surface of insulating film 113 and the entire main surface of source electrode 116. A conducting film made of aluminum was formed by sputtering on a main surface of the resist mask and on the main surface of insulating film 113 exposed through the opening of the resist mask. The resist mask was then removed. That is, the conducting film formed on the main surface of the resist mask was removed (lifted off) along with the resist mask, leaving only the conducting film formed on the main surface of insulating film 113 as gate electrode 117.

Next, a drain electrode 118 was formed on a rear surface of SiC substrate 110. As drain electrode 118, a conducting film made of nickel was formed by sputtering on the rear surface of SiC substrate 110.

By performing the steps described above, various DMOSFETs 100 shown in FIG. 21 each having a channel in a range of not more than −90° from the <11-20> direction were manufactured. Relation between an angle (°) with respect to the <-2110> direction in main surface 112a (crystallographic plane inclined at not less than 50° and not more than 65° in the <1-100> direction as well as at not less than −10° and not more than 10° in the <11-20> direction with respect to the {0001} plane) of semiconductor layer 112 in DMOSFETs 100 having the various channel directions and channel mobility (relative value) was determined. The results are shown in FIG. 22.

Figure 22:
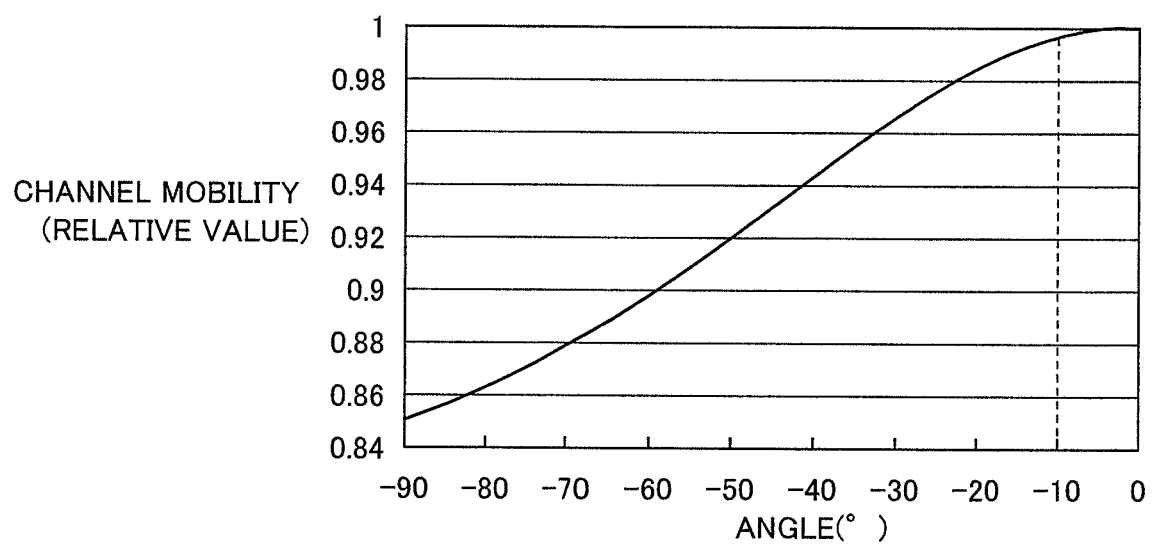
FIG. 22 illustrates relation between an angle from the <11-20> direction and channel mobility according to the embodiment.

In FIG. 22, a vertical axis represents the channel mobility (relative value), while a horizontal axis represents the angle (°) with respect to the <11-20> direction in main surface 112a of semiconductor layer 112. The angle (°) on the horizontal axis in FIG. 22 does not limit a direction of inclination with respect to the <11-20> direction. Accordingly, −10° on the horizontal axis refers to both a direction inclined at +10° and a direction inclined at −10° with respect to the <11-20> direction.

The channel mobility (relative value) on the vertical axis in FIG. 22 is represented in a relative value, with channel mobility in the <11-20> direction in main surface 112a of semiconductor layer 112 being assumed as 1. A portion corresponding to an angle (°) of 0° on the horizontal axis in FIG. 22 indicates the <11-20> direction in main surface 112a of semiconductor layer 112.

As shown in FIG. 22, it can be seen that the channel mobility is the highest when the channel direction is in the direction of an angle of 0° with respect to the <11-20> direction (<11-20 direction>) in main surface 112a of semiconductor layer 112, and that the channel mobility tends to be lower with increase in deviation from the <11-20> direction in main surface 112a of semiconductor layer 112.

The present inventors found that the tendency shown in FIG. 22 applies whenever main surface 112a of semiconductor layer 112 is a crystallographic plane inclined at not less than 50° and not more than 65° in the <1-100> direction as well as at not less than −10° and not more than 10° in the <11-20> direction with respect to the {0001} plane.

Therefore, from the viewpoint of achieving high channel mobility, the channel direction being in the <11-20> direction in main surface 112a of semiconductor layer 112 is considered most preferable.

Even when the channel direction is in a direction having an angle of not less than −10° and not more than 0° with respect to the <11-20> direction in main surface 112a of semiconductor layer 112 (i.e., a direction inclined at ±10° in the <11-20> direction), the channel mobility (relative value) is higher than 0.99, as shown in FIG. 22. Accordingly, variation to some extent in channel mobility of DMOSFET 100 is unlikely to cause significant reduction in channel mobility.

It was therefore found that high channel mobility could be achieved with excellent repeatability by forming DMOSFET 100 such that DMOSFET 100 has a channel direction in a range of inclination of ±10° in the <11-20> direction in main surface 112a of semiconductor layer 112.

In order to fabricate a semiconductor device such as a DMOSFET of high channel mobility as described above, the <11-20> direction in main surface 112a of semiconductor layer 112 needs to be identified. Since main surface 112a of semiconductor layer 112 has the same crystal orientation as that of main surface 111 of SiC substrate 110, the <11-20> direction needs to be identified in main surface 111 of SiC substrate 110. SiC substrates 10, 30 and 40 according to the present invention include first ori-fla 12, third side 31c, and mark 45 for identifying the <11-20> direction, respectively. Accordingly, the <11-20> direction can be identified in main surface 112a of semiconductor layer 112, so that a channel can be formed to have high mobility.

As described above, according to the present example, it was confirmed that channel mobility was high in the direction inclined at not less than −10° and not more than 10° in the <11-20> direction in a semiconductor device fabricated on the plane inclined at not less than 50° and not more than 65° in the <1-100> direction with respect to the {0001} plane.

It was also confirmed that SiC substrates 10, 30 and 40 of the present invention including first ori-fla 12, third side 31c, and mark 45 for identifying the <11-20> direction, respectively, allow fabrication of a SiC semiconductor of high channel mobility.

Although the embodiments and examples of the present invention have been described and illustrated above, it is originally planned to combine the features of the embodiments and examples as appropriate. Further, it should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

DESCRIPTION OF THE REFERENCE SIGNS 10, 30, 40, 110 SiC substrate; 11, 21a, 31, 41, 111, 112a main surface; 12 first ori-fla; 13 second ori-fla; 21 base substrate; 22 ingot; 31a, 41a first side; 31b, 41b second side; 31c third side; 32 to 34, 42, 43 side surface; 45 mark; 47 substrate; 100 DMOSFET; 112 semiconductor layer; 113 insulating film; 114 p type impurity diffusion layer; 115 n type impurity diffusion layer; 116 source electrode; 117 gate electrode; 118 drain electrode; L12, L13, L31a, L31b length; C1, C2 plane; X direction.

The invention claimed is:
1. A silicon carbide substrate comprising:
    a main surface having a circular or elliptical plane shape and being inclined at not less than 50° and not more than 65° in a <1-100> direction as well as at not less than −10° and not more than 10° in a <11-20> direction with respect to a {0001} plane;
    a first orientation flat parallel to the <11-20> direction; and
    a second orientation flat being in a direction intersecting said first orientation flat and being different from said first orientation flat in length.
2. The silicon carbide substrate according to claim 1, wherein
    said second orientation flat is orthogonal to said first orientation flat.
3. The silicon carbide substrate according to claim 1, wherein
    side surfaces including said first and second orientation flats, respectively, are inclined at not less than −10° and not more than 10° in a direction perpendicular to said main surface.
4. A silicon carbide substrate comprising a main surface having a rectangular plane shape and being inclined at not less than 50° and not more than 65° in a <1-100> direction as well as at not less than −10° and not more than 10° in a <11-20> direction with respect to a {0001} plane,
    said main surface including
        a first side parallel to the <11-20> direction,
        a second side in a direction perpendicular to said first side, and
        a third side connecting said first side to said second side, wherein a length of said third side projected in a direction in which said first side extends is different from a length of said third side projected in a direction in which said second side extends.

5. A silicon carbide substrate comprising a main surface having a rectangular plane shape and being inclined at not less than 50° and not more than 65° in a <1-100> direction as well as at not less than −10° and not more than 10° in a <11-20> direction with respect to a {0001} plane,
   said main surface including
      a first side parallel to the <11-20> direction,
      a second side in a direction perpendicular to said first side, and
      a mark formed in vicinity of a corner where said first side is connected to said second side.

6. The silicon carbide substrate according to claim 5, wherein
   said mark is a laser-irradiated mark, or a scratch by a diamond pen.

7. The silicon carbide substrate according to claim 5, wherein
   said first side is different from said second side in length.

8. The silicon carbide substrate according to claim 5, wherein
   side surfaces including said first and second sides, respectively, are inclined at not less than −10° and not more than 10° in a direction perpendicular to said main surface.

9. A method of manufacturing a silicon carbide substrate, comprising the steps of:
   preparing a silicon carbide ingot;
   cutting a silicon carbide substrate including a main surface having a circular or elliptical plane shape and being inclined at not less than 50° and not more than 65° in a <1-100> direction as well as at not less than −10° and not more than 10° in a <11-20> direction with respect to a {0001} plane from said ingot; and
   forming a first orientation flat parallel to the <11-20> direction and a second orientation flat being in a direction intersecting said first orientation flat and being different from said first orientation flat in length on said silicon carbide substrate.

10. A method of manufacturing a silicon carbide substrate, comprising the steps of:
   preparing a silicon carbide ingot;
   forming a first orientation flat parallel to a <11-20> direction and a second orientation flat being in a direction intersecting said first orientation flat and being different from said first orientation flat in length on said ingot; and
   cutting a silicon carbide substrate including a main surface having a circular or elliptical plane shape and being inclined at not less than 50° and not more than 65° in a <1-100> direction as well as at not less than −10° and not more than 10° in the <11-20> direction with respect to a {0001} plane from the ingot including said first and second orientation flats.

11. A method of manufacturing a silicon carbide substrate, comprising the steps of:
   preparing a silicon carbide ingot; and
   cutting a silicon carbide substrate including a main surface having a rectangular plane shape and being inclined at not less than 50° and not more than 65° in a <1-100> direction as well as at not less than −10° and not more than 10° in a <11-20> direction with respect to a {0001} plane,
   said silicon carbide substrate being cut from said ingot in said cutting step such that said main surface includes a first side parallel to the <11-20> direction, a second side in a direction perpendicular to said first side, and a third side connecting said first side to said second side, with a length of said third side projected in a direction in which said first side extends being different from a length of said third side projected in a direction in which said second side extends.

12. A method of manufacturing a silicon carbide substrate, comprising the steps of
   preparing a silicon carbide ingot;
   processing said ingot such that said ingot includes a first side parallel to a <11-20> direction, a second side in a direction perpendicular to said first side, and a third side connecting said first side to said second side, with a length of said third side projected in a direction in which said first side extends being different from a length of said third side projected in a direction in which said second side extends, on a plane inclined at not less than 50° and not more than 65° in a <1-100> direction as well as at not less than −10° and not more than 10° in the <11-20> direction with respect to a {0001} plane; and
   cutting a silicon carbide substrate including a main surface having a rectangular plane shape and being inclined at not less than 50° and not more than 65° in the <1-100> direction as well as at not less than −10° and not more than 10° in the <11-20> direction with respect to the {0001} plane from said ingot.

13. A method of manufacturing a silicon carbide substrate, comprising the steps of:
   preparing a silicon carbide ingot; and
   cutting a silicon carbide substrate including a main surface having a rectangular plane shape and being inclined at not less than 50° and not more than 65° in a 1-100> direction as well as at not less than −10° and not more than 10° in a <11-20> direction with respect to a {0001} plane,
   said cutting step including the steps of
      cutting said silicon carbide substrate from said ingot such that said substrate includes a first side parallel to the <11-20> direction and a second side in a direction perpendicular to said first side, and
      forming a mark in vicinity of a corner where said first side is connected to said second side in said main surface.

* * * * *